United States Patent
Sugiyama

(10) Patent No.: US 11,320,486 B2
(45) Date of Patent: May 3, 2022

(54) OPTICAL DEVICE AND OPTICAL TRANSCEIVER MODULE

(71) Applicant: Fujitsu Optical Components Limited, Kawasaki (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 284 days.

(21) Appl. No.: 16/503,696

(22) Filed: Jul. 5, 2019

(65) Prior Publication Data

US 2020/0064404 A1 Feb. 27, 2020

(30) Foreign Application Priority Data

Aug. 23, 2018 (JP) .............................. JP2018-156557

(51) Int. Cl.
| | |
|---|---|
| *G01R 31/3185* | (2006.01) |
| *G02B 27/28* | (2006.01) |
| *H04B 10/40* | (2013.01) |
| *G01R 31/28* | (2006.01) |

(52) U.S. Cl.
CPC .... *G01R 31/318511* (2013.01); *G01R 31/282* (2013.01); *G02B 27/283* (2013.01); *H04B 10/40* (2013.01)

(58) Field of Classification Search
CPC ....... H01L 21/00; H01L 2221/00; G02B 1/00; G02B 2207/00; H01P 1/00
See application file for complete search history.

(56) References Cited

U.S. PATENT DOCUMENTS

| | | | |
|---|---|---|---|
| 9,459,177 B1 | 10/2016 | Dong et al. | |
| 2011/0019956 A1* | 1/2011 | Sugiyama | ............... G02F 1/035 385/2 |
| 2013/0209020 A1 | 8/2013 | Doerr et al. | |
| 2014/0010498 A1* | 1/2014 | Versiegers | ............... G02B 6/30 385/37 |

(Continued)

FOREIGN PATENT DOCUMENTS

| | | |
|---|---|---|
| CN | 1965240 A | 5/2007 |
| CN | 107532967 | 1/2018 |

(Continued)

OTHER PUBLICATIONS

Chinese Office Action dated Aug. 7, 2020 from Chinese Patent Application No. 201910705914.0, 13 pages.

(Continued)

*Primary Examiner* — Jermele M Hollington
*Assistant Examiner* — Temilade S Rhodes-Vivour
(74) *Attorney, Agent, or Firm* — Staas & Halsey LLP

(57) ABSTRACT

An optical device is formed on an optical IC chip. The shape of the optical IC chip is rectangular or parallelogram. The optical device induces: an optical device circuit; a first optical waveguide that is coupled to the optical device circuit; a pad that is electrically connected to the optical device circuit; a grating coupler; and a second optical waveguide that is coupled to the grating coupler. The pad is formed in a region close to a first side of the optical IC chip. The grating coupler is formed in a specified region, which is not close to the first side, on the optical IC chip. The first optical waveguide and the second optical waveguide are respectively extended to an edge of the optical IC chip.

12 Claims, 11 Drawing Sheets

(56) References Cited

U.S. PATENT DOCUMENTS

| | | | |
|---|---|---|---|
| 2015/0078763 A1* | 3/2015 | Sugiyama | G02F 1/225 398/200 |
| 2015/0117865 A1* | 4/2015 | Sonoda | H04B 10/07955 398/140 |
| 2015/0295675 A1 | 10/2015 | Sugama | |
| 2016/0290891 A1 | 10/2016 | Feng et al. | |
| 2016/0315661 A1* | 10/2016 | Henry | G01R 31/44 |
| 2017/0082799 A1 | 3/2017 | Novack et al. | |
| 2017/0307687 A1* | 10/2017 | Grosse | G01R 31/2884 |
| 2018/0335365 A1 | 11/2018 | Kamei et al. | |

FOREIGN PATENT DOCUMENTS

| | | |
|---|---|---|
| JP | 2007-528129 | 10/2007 |
| JP | 2012-523014 | 9/2012 |
| WO | 2005/086786 | 9/2005 |
| WO | 2010/113015 | 10/2010 |
| WO | 2014/112077 A1 | 7/2014 |
| WO | 2017/085934 | 5/2017 |

OTHER PUBLICATIONS

Chinese Office Action dated May 31, 2021 from Chinese Application No. 201910705914.0.

Office Action dated Mar. 1, 2022 for Japanese Patent Application No. 2018-156557.

\* cited by examiner

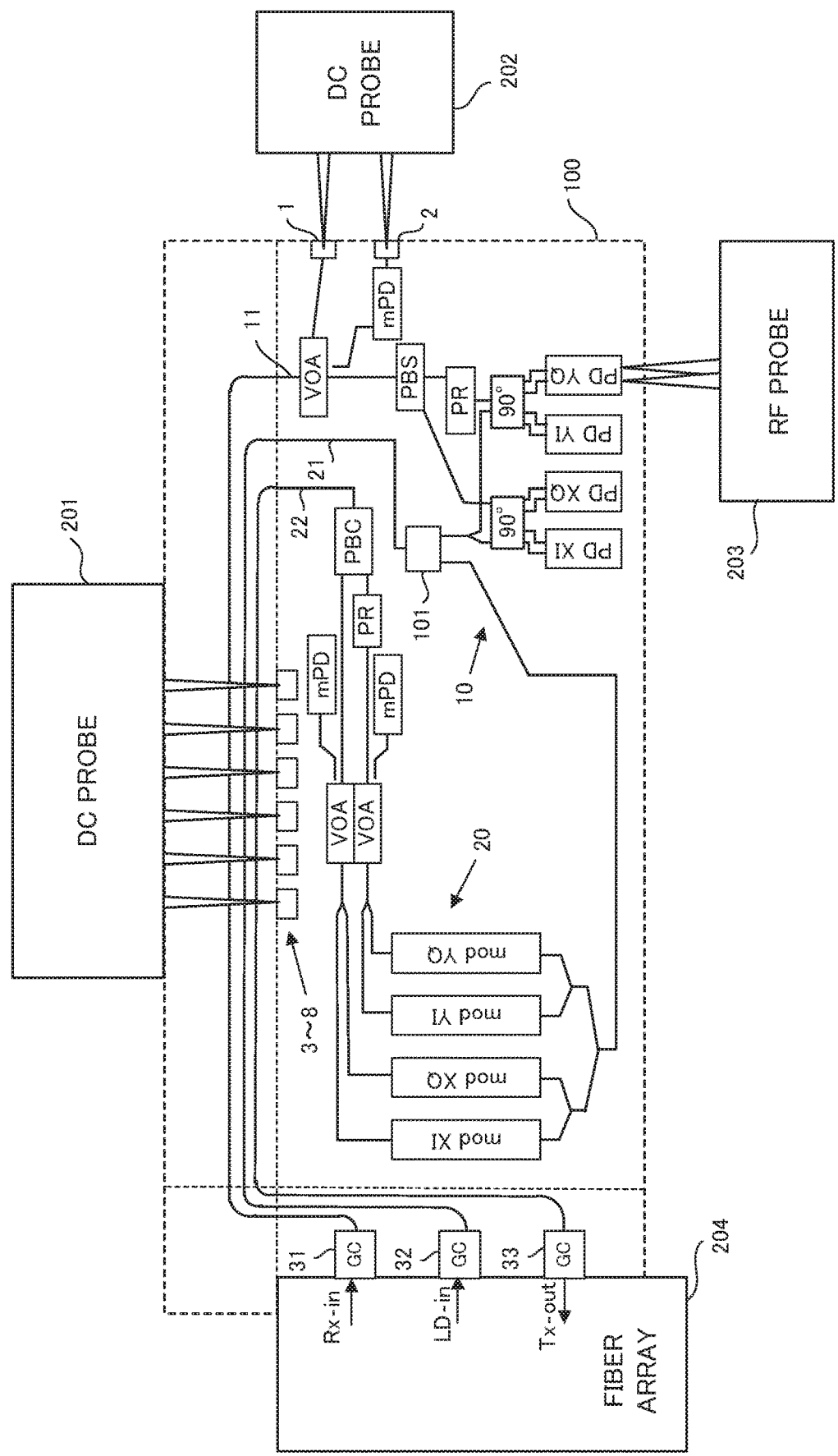
F I G. 7

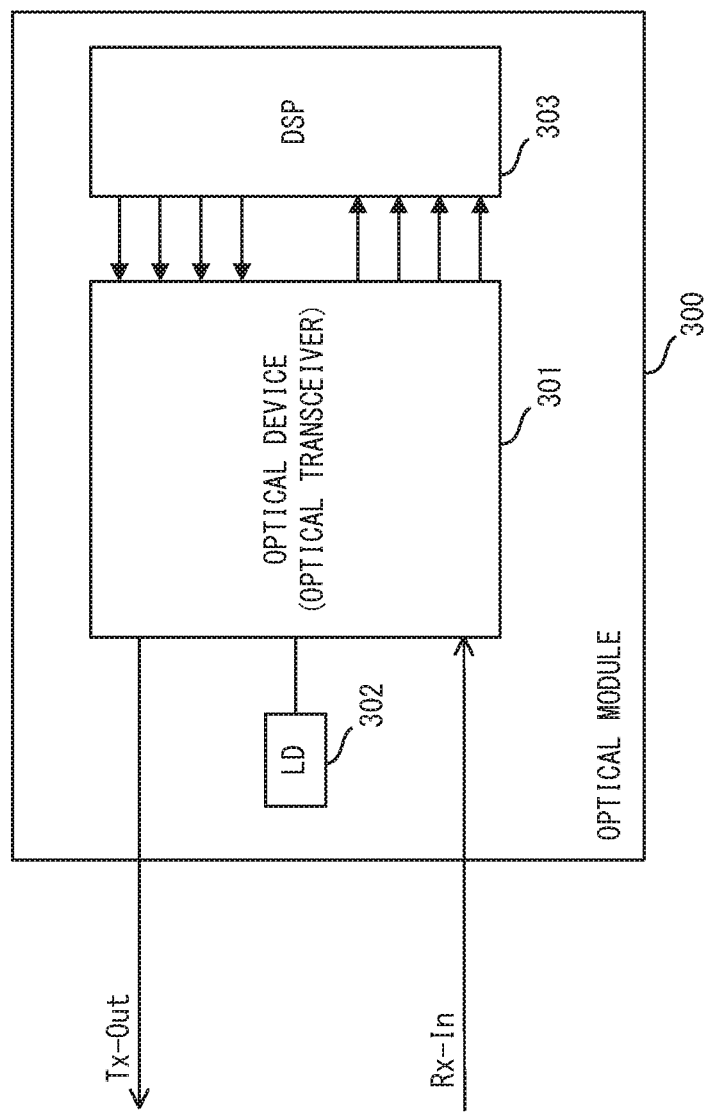
F I G. 11

OPTICAL DEVICE AND OPTICAL TRANSCEIVER MODULE

CROSS-REFERENCE TO RELATED APPLICATIONS

This application is based upon and claims the benefit of priority of the prior Japanese Patent Application No. 2018-156557, filed on Aug. 23, 2018, the entire contents of which are incorporated herein by reference.

FIELD

The embodiments discussed herein are related to an optical device and an optical transceiver module.

BACKGROUND

FIG. 1 illustrates an example of an optical device. The optical device in this example includes an optical receiver 10 and an optical modulator 20. The optical device is provided with continuous wave light LD_in generated by a light source, which is not illustrated.

The optical receiver 10 includes a variable optical attenuator (VOA), a monitoring photodetector (mPD), a polarization beam splitter (PBS), a polarization rotator (PR), 90-degree optical hybrid circuits, and photodetectors (PDXI, PDXQ, PDYI, PDYQ). The optical receiver 10 generates electric field information signals RF_out that represent received optical signal Rx_in by means of coherent detection using the continuous wave light LD_in. Note that the amount of attenuation in the VOA is controlled by a power control signal provided via a pad 1. A monitor signal that represents received optical power monitored by the mPD is output via a pad 2.

The optical modulator 20 includes modulators (modXI, modXQ, modYI, modYQ), variable optical attenuators (VOA), monitor photodetectors (mPD), a polarization rotator (PR), and a polarization beam combiner (PBC). The optical modulator 20 modulates continuous wave light LD_in with data signals RF_in and generates a modulated optical signal Tx_out. Note that the phase of the modulated optical signals that correspond to each polarization is controlled by phase control signals provided via pads 3 and 4. In the VOA, the amount of attenuation that corresponds to each polarization is controlled by power control signals provided via pads 5 and 6. Monitor signals that represent optical transmission power that corresponds to each polarization monitored by the mPD are output via pads 7 and 8.

The optical device is formed on an optical IC chip. When an optical IC chip is tested, an optical fiber is aligned with each optical waveguide at an edge of the chip. More specifically, the optical signal Rx_in and the continuous wave light LD_in are input to optical waveguides from an edge of an optical IC chip. The optical signal Tx_out generated by the optical modulator 20 is output from an edge of the optical IC chip through an optical waveguide. In addition, a DC probe is in contact with each of the pads 1 to 8. More specifically, electric signals are input via the pads 1 and 3 to 6 and electric signals are output via the pads 2, 7, and 8. Note that in a test of the optical receiver 10, light sensitivity and an extinction ratio etc. are measured for each polarization. In a test of the optical modulator 20, insertion loss and an extinction ratio etc. are measured for each polarization.

The above-described testing method is employed in testing an optical IC chip after the optical IC chip is cut out of a wafer. At that time, an optical fiber needs to be aligned with an edge face of each optical waveguide formed on the optical IC chip. For that reason, a test of an optical device takes a long time.

FIG. 2 illustrates an example of an optical IC chip. A test of the optical IC chip illustrated in FIG. 2 is conducted on a wafer before the chip is cut out of the wafer. In order to test an optical IC chip on a wafer, a configuration that guides light irradiated on a surface of the wafer into the optical receiver 10 and the optical modulator 20 and a configuration that obtains a modulated optical signal generated by the optical modulator 20 from the surface of the wafer are necessary. In the example illustrated in FIG. 2, grating couplers are formed near the optical devices on the wafer.

In the example illustrated in FIG. 2, a GC region for forming grating couplers 31 to 33 is provided next to a device region for forming optical devices. At the time of testing the optical devices, an optical signal Rx_in is input to the optical IC chip via the grating coupler 31 and is guided into the optical receiver 10 through an optical waveguide. Continuous wave light LD_in is input to the optical IC chip via the grating coupler 32 and is guided into the optical receiver 10 and the optical modulator 20 through an optical waveguide and a split coupler. An optical signal Tx_out generated by the optical modulator 20 is guided into the GC region through an optical waveguide and is radiated from the grating coupler 33. In this case, at the time of testing the optical IC chip, corresponding optical fibers are arranged near the grating couplers 31 to 33 formed on a surface of a wafer. In this manner, before each optical IC chip is cut out of the wafer, the optical IC chip can be tested on the wafer. After the test, each optical IC chip is cut out of the wafer and the GC region is separated from the device region.

Note that a method of testing an optical device or an optical IC chip is disclosed in, for example, U.S. Pat. No. 9,459,177 and WO2014/112077.

In order to efficiently test the optical IC chip illustrated in FIG. 2, the plural optical fibers arranged near the grating couplers 31 to 33 are preferably an optical fiber array. However, in the optical IC chip illustrated in FIG. 2, the grating couplers 31 to 33 and the pads 3 to 8 are arranged close to each other. In such a case, as illustrated in FIG. 3, a DC probe for inputting or outputting electric signals via the pads 3 to 8 physically interferes with the optical fiber array. In other words, a test of an optical system and a test of an electrical system may not be conducted at the same time.

SUMMARY

According to an aspect of the embodiments, an optical device is formed on an optical IC (integrated circuit) chip having a rectangular shape or a shape of a parallelogram. The optical device includes: an optical device circuit; a first optical waveguide that is coupled to the optical device circuit; a pad that is electrically connected to the optical device circuit; a grating coupler; and a second optical waveguide that is coupled to the grating coupler. The pad is formed in a region close to a first side of the optical IC chip. The grating coupler is formed in a specified region, which is not close to the first side, on the optical IC chip. The first optical waveguide and the second optical waveguide are respectively extended to an edge of the optical IC chip.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates an example of a method of testing an optical IC chip;
FIG. 11 illustrates an example of an optical module.

DESCRIPTION OF EMBODIMENTS

Figure 1:
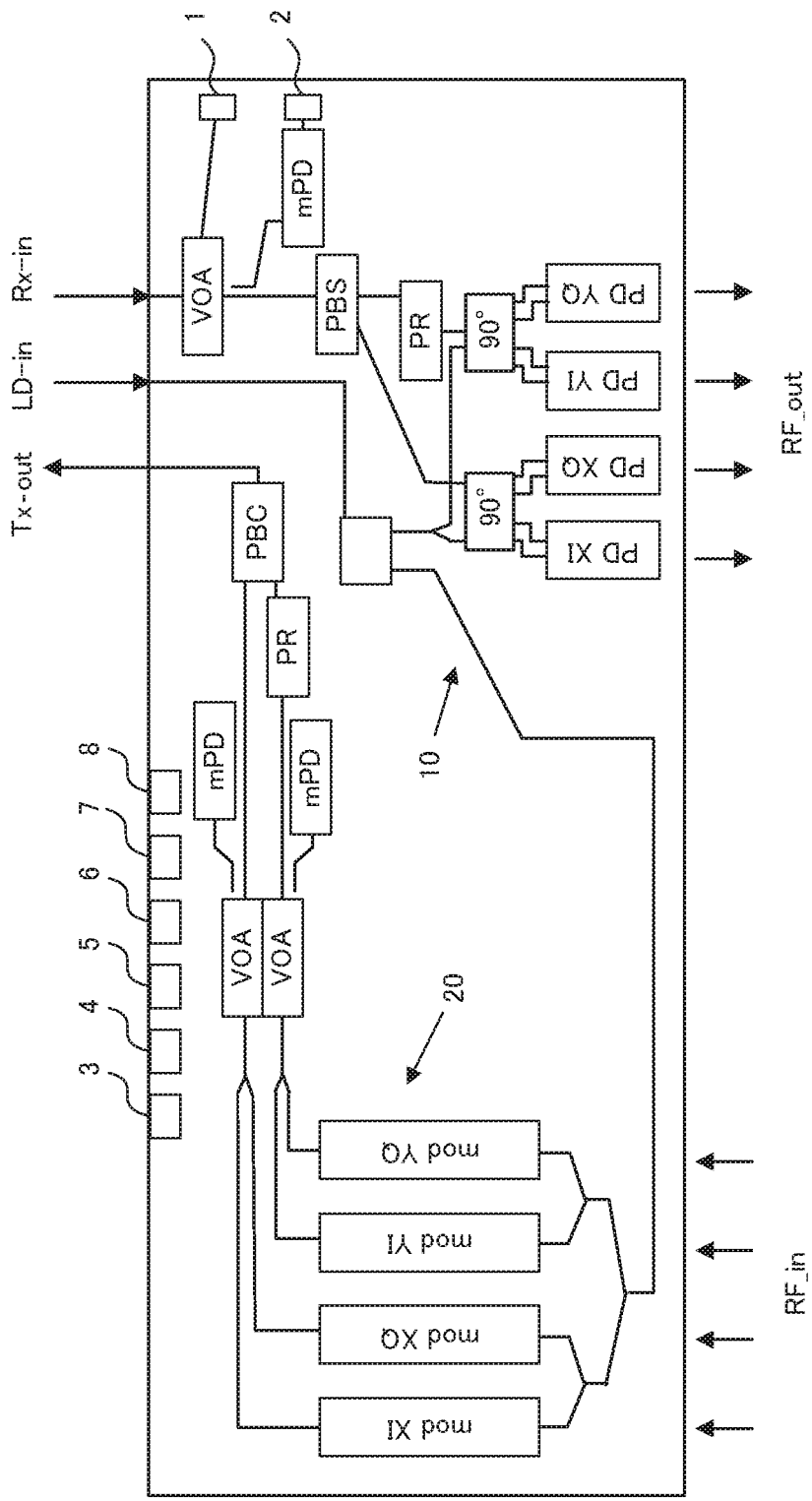
FIG. 1 illustrates an example of an optical device.
Figure 2:
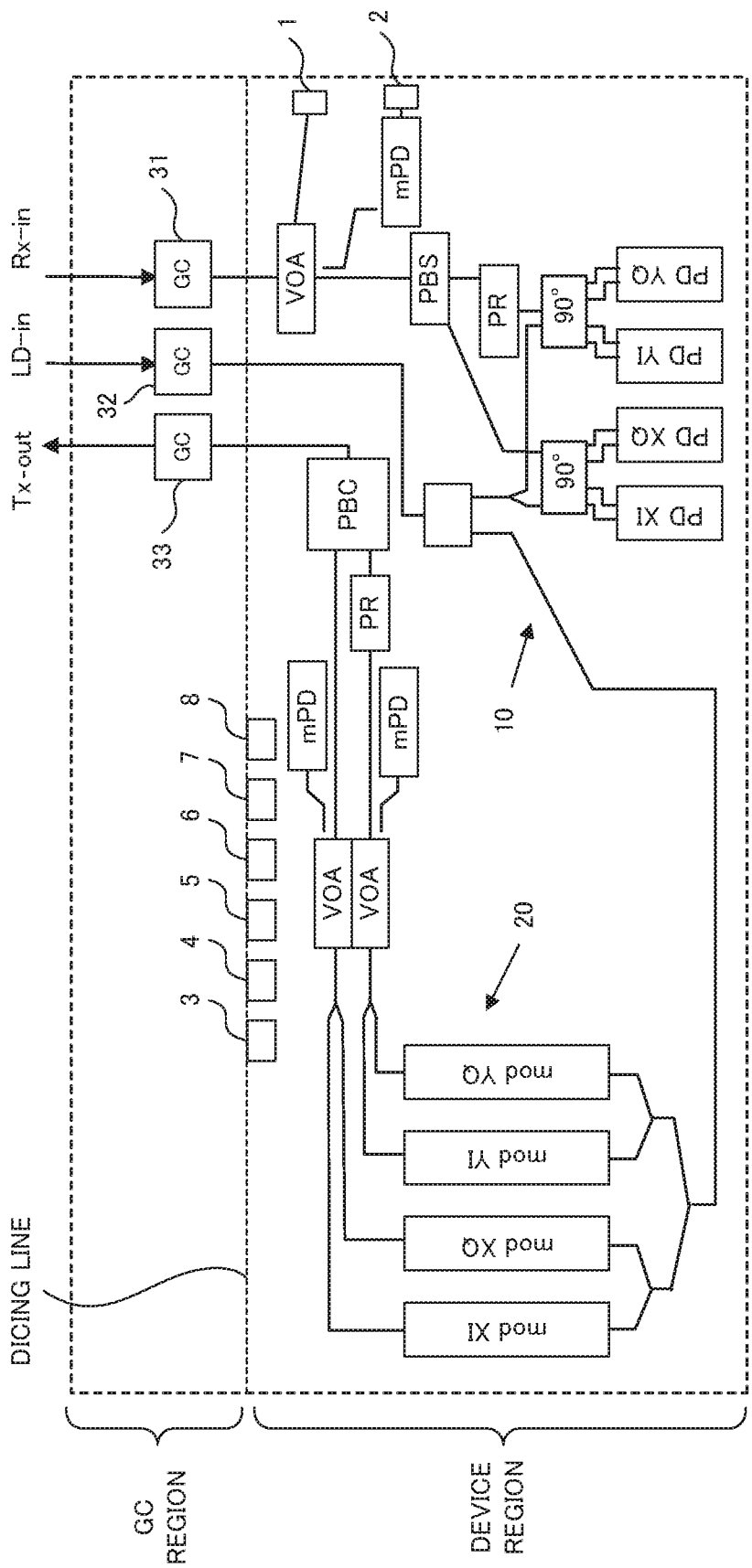
FIG. 2 illustrates an example of an optical IC chip.
Figure 3:
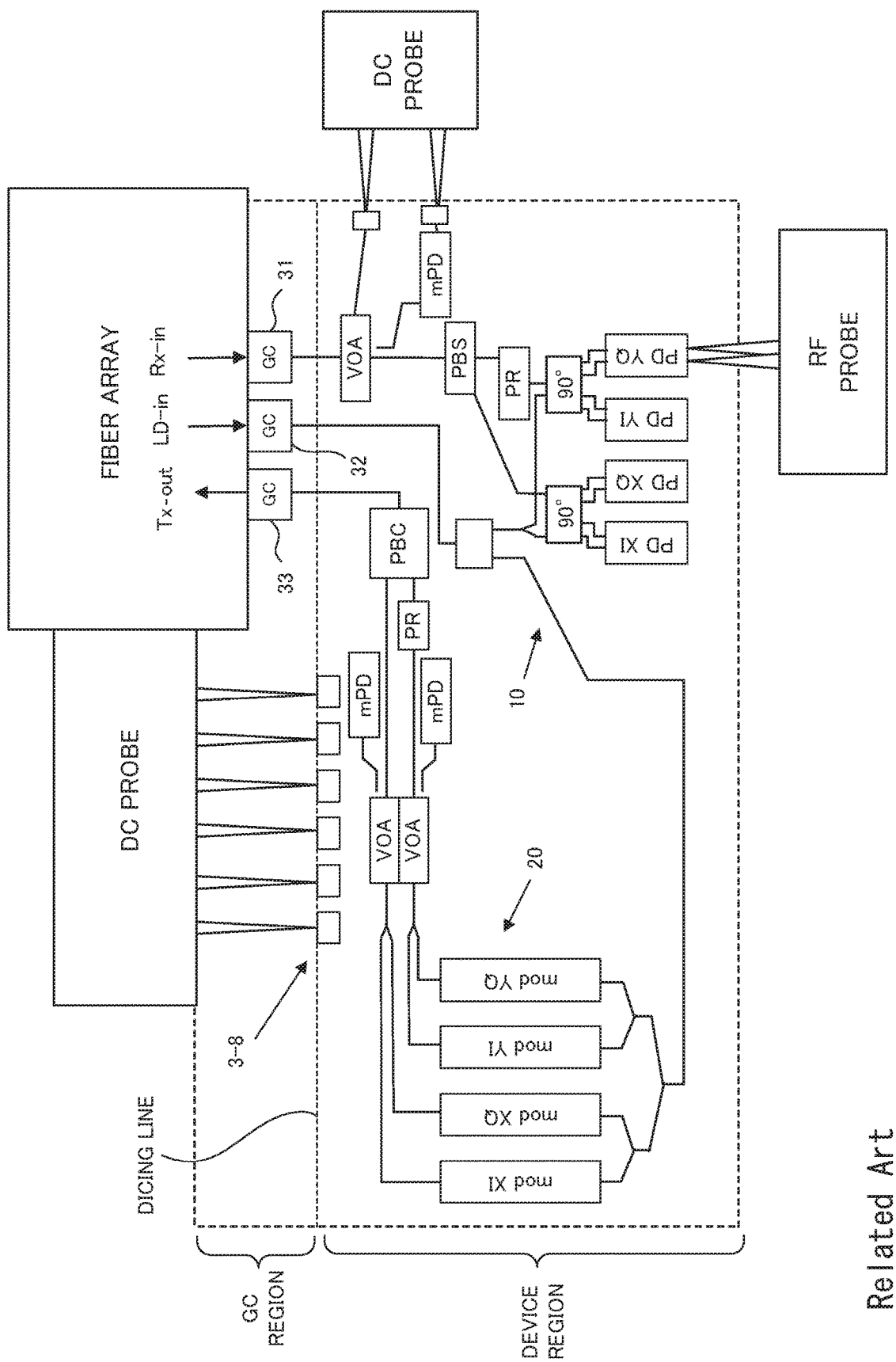
FIG. 3 describes a problem of a conventional art.
Figure 4:
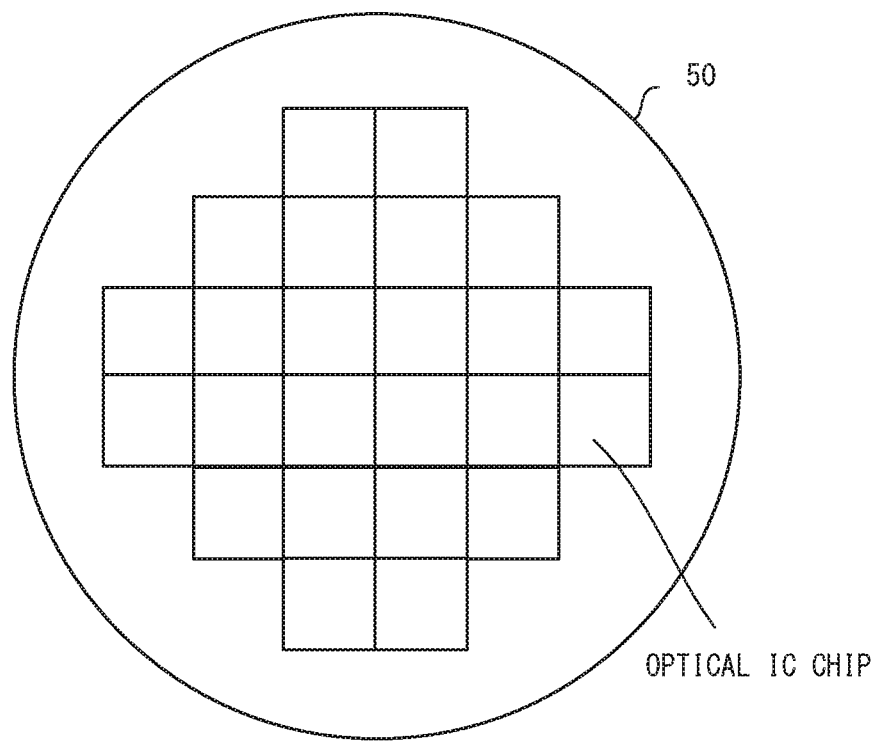
FIG. 4 illustrates an example of a wafer on which plural optical IC chips are formed.

FIG. 4 illustrates an example of a wafer on which a plurality of optical IC chips are formed. A plurality of optical IC chips are formed in a surface area of a wafer 50. In the example illustrated in FIG. 4, 24 optical IC chips are formed on the wafer 50.

In this example, each of the optical IC chips provides an optical device including an optical receiver and an optical modulator (that is, the optical device is an optical transceiver). Therefore, a plurality of optical devices may be obtained by dicing from the wafer 50. The test of each optical device is performed on the wafer 50 before cutting out the respective optical IC chips from the wafer 50.

First Embodiment

Figure 5:
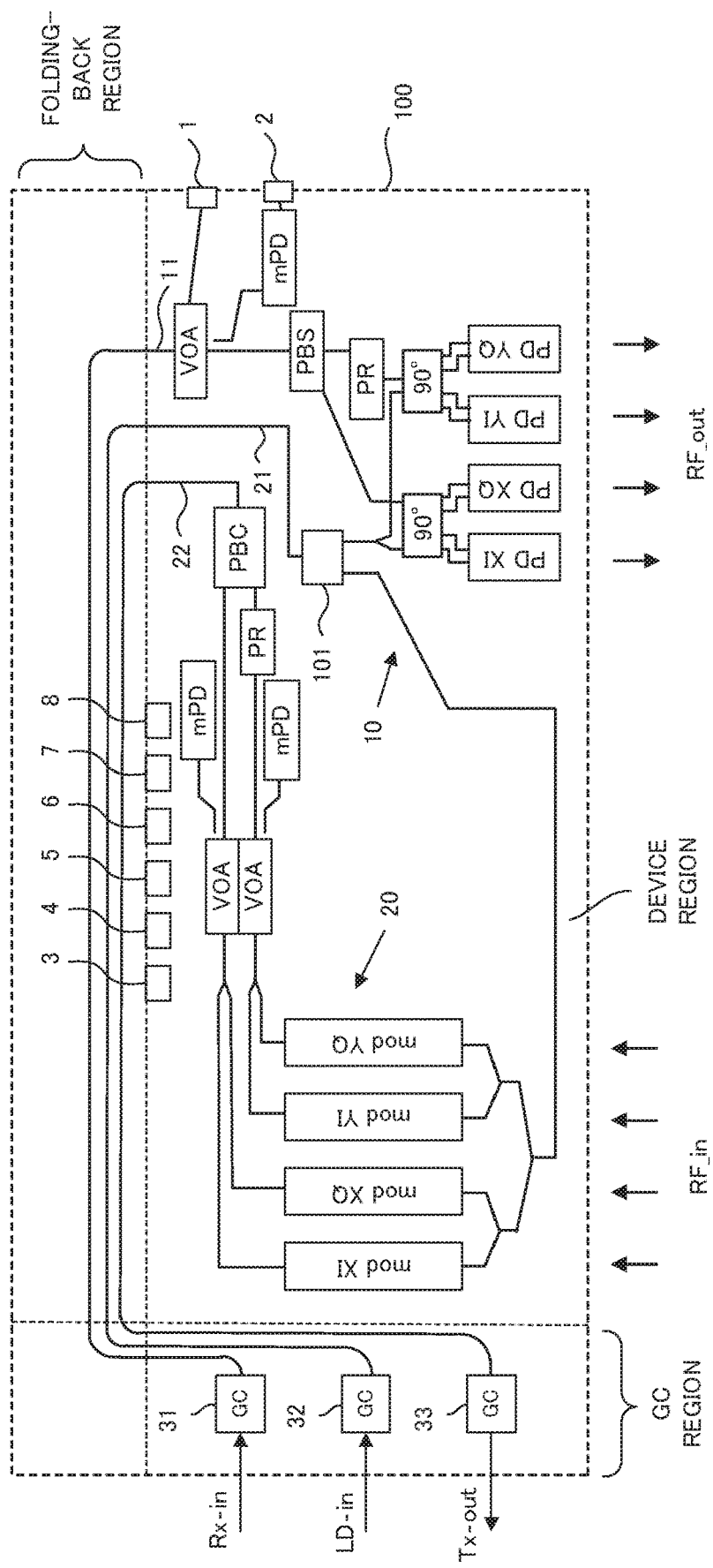
FIG. 5 illustrates an example of an optical IC chip according to the first embodiment.

FIG. 5 illustrates an example of an optical IC chip according to the first embodiment. In this embodiment, an optical IC chip 100 includes a device region, a GC region, and a folding-back region, as illustrated in FIG. 5. In the device region, optical device circuit is formed. In this embodiment, the optical device circuit includes an optical receiver 10 and an optical modulator 20. In the GC region, one or more grating couplers are formed. In this embodiment, grating couplers 31 to 33 are formed in the GC region. In the folding-back region, some portions of optical waveguides that couple the optical device circuit with grating couplers 31 to 33 are formed.

In the embodiments described below, the optical device circuit that is formed on an optical IC chip includes an optical receiver 10 and an optical modulator 20, but the embodiments are not limited to this configuration. In other words, such a configuration that the optical device circuit includes either one of the optical receiver 10 and the optical modulator 20 may be also possible.

In the device region, the optical receiver 10, the optical modulator 20, and optical waveguides 11, 21, and 22 are formed. The optical waveguide 11 is coupled to an optical input port of the optical receiver 10. The optical waveguide 21 is coupled to an optical input port of the optical receiver 10 and an optical input port of the optical modulator 20 through a split coupler 101. When the optical receiver 10 is not a coherent receiver, the optical waveguide 21 may be coupled to an optical input port of the optical modulator 20 alone. The optical waveguide 22 is coupled to an optical output port of the optical modulator 20.

The optical receiver 10 includes a variable optical attenuator (VOA), a monitoring photodetector (mPD), a polarization beam splitter (PBS), a polarization rotator (PR), 90-degree optical hybrid circuits (90°), and photodetectors (PDXI, PDXQ, PDYI, PDYQ). To the optical receiver 10, an optical signal Rx_in is input through the optical waveguide 11 and continuous wave light LD_in is input through the optical waveguide 21 and the optical coupler 101.

The variable optical attenuator VOA attenuates the received optical signal Rx_in in accordance with a power control signal given via a pad 1. The monitoring photodetector mPD monitors output optical power of the variable optical attenuator VOA. A monitor signal obtained by the monitoring photodetector mPD is output via a pad 2. The polarization beam splitter PBS splits the input optical signal into X-polarized optical signal and Y-polarized optical signal. The polarization rotator PR rotates the polarization of the Y-polarized optical signal by 90 degrees. Each 90-degree optical hybrid circuit extracts I (In-phase) component and Q (Quadrature) component from the input optical signal by using the continuous wave light LD_in. The photodetectors (PDXI, PDXQ, PDYI, PDYQ) convert the input optical signals into electric signals. In consequence of the above processing, electric field information signals RF_out (XI, XQ, YI, YQ) that represent received optical signal RX_in are generated.

The optical modulator 20 includes modulators (modXI, modXQ, modYI, modYQ), variable optical attenuators (VOA), monitoring photodetectors (mPD), a polarization rotator (PR), and a polarization beam combiner (PBC). To the optical modulator 20, continuous wave light LD_in is input through an optical waveguide 21 and the optical coupler 101. Electric signals RF_in that represent transmission data are also given to the optical modulator 20.

The modulators (modXI, modXQ, modYI, modYQ) modulate the continuous wave light LD_in with the electric signals RF_in and generate modulated optical signals XI, XQ, YI, and YQ. The modulated optical signals XI and XQ are combined, and modulated optical signal X is generated. At that time, the phase of the modulated optical signal XI or XQ is controlled by a phase control signal provided via a pad 3. In a similar manner, the modulated optical signals YI and YQ are combined, and modulated optical signal Y is generated. At that time, the phase of the modulated optical signal YI or YQ is controlled by a phase control signal provided via a pad 4. The variable optical attenuators VOA attenuate the modulated optical signals X and Y in accordance with power control signals provided via pads 5 and 6, respectively.

The monitoring photodetectors mPD respectively monitor output optical power of the variable optical attenuators VOA. The monitor signals obtained by the monitoring photodetectors mPD are output via pads 7 and 8. The polarization rotator PR rotates the polarization of the modulated optical signal Y by 90 degrees. The polarization beam combiner PBC combines the modulated optical signals X and Y and generates modulated optical signal Tx_out. The modulated optical signal Tx_out is output through an optical waveguide 22.

Figure 6:
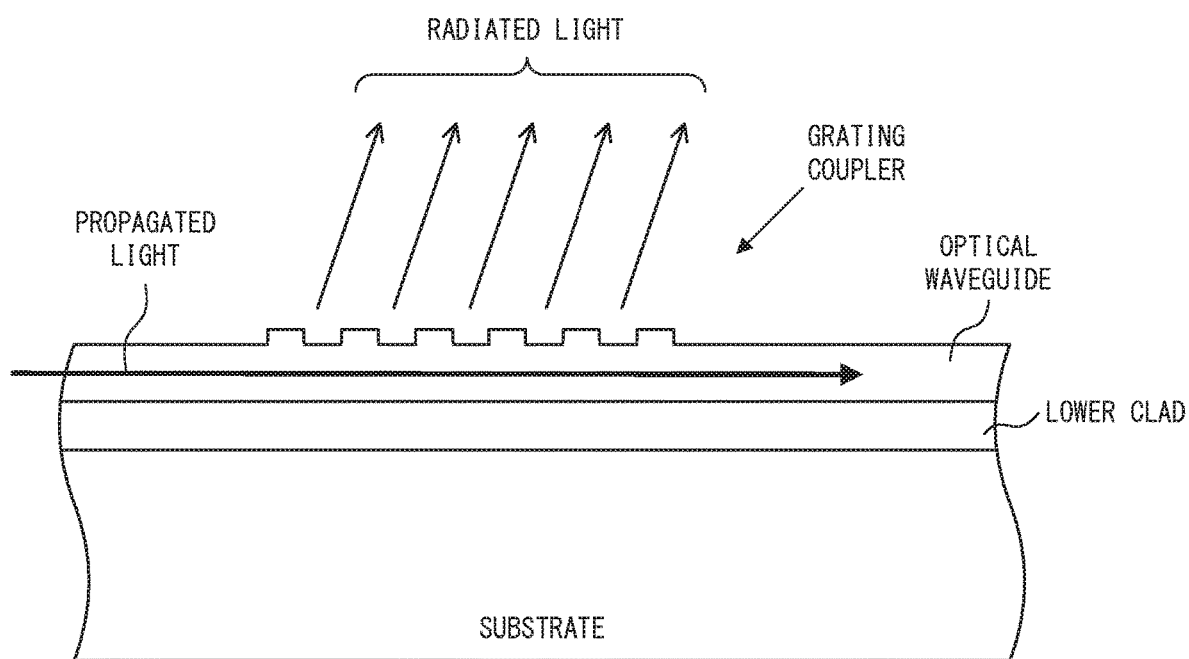
FIG. 6 illustrates an example of a radiation by a grating coupler.

Grating couplers (GC) 31 to 33 are formed in the GC region. The grating couplers are formed by making gratings on a surface of a waveguide, as an example. As illustrated in FIG. 6, when propagated light that propagates via the optical waveguide passes through the grating coupler, a part of the propagated light is emitted in a specified direction with respect to the substrate. In the description below, the direction in which a part of propagated light is emitted by the grating coupler may be referred to as the "diffracted radiation direction".

Therefore, by placing the tip surface of the optical fiber near the grating coupler, it becomes possible to obtain light propagating via the optical waveguide. In addition, by placing the tip surface of the optical fiber near the grating coupler, it becomes possible for light to enter the optical waveguide via the optical fiber. That is, the grating coupler is able to optically couple the optical fiber and the optical waveguide on the surface of the optical IC chip.

It is preferable for the grating couplers 31 to 33 to be formed at equal spacing on a straight line. In addition, it is preferable for the grating couplers 31 to 33 to be formed so that their diffracted radiation directions become the same. In this case, by having a fiber array that contains plural optical fibers arranged near the grating couplers 31 to 33, the plural optical fibers can be collectively coupled to the optical IC chip.

The grating coupler 31 is coupled to the optical waveguide 11. The grating coupler 31 is therefore coupled to the optical receiver 10 through the optical waveguide 11. The grating coupler 32 is coupled to the optical waveguide 21. The grating coupler 32 is therefore coupled to the optical modulator 20 (and the optical receiver 10) through the optical waveguide 21. The grating coupler 33 is coupled to the optical waveguide 22. The grating coupler 33 is therefore coupled to the optical modulator 20 through the optical waveguide 22.

Here, the optical waveguides 11, 21, and 22 run through a folding-back region. More specifically, a portion of the optical waveguide 11, which couples the grating coupler 31 with the optical receiver 10, is formed in the folding-back region. A portion of the optical waveguide 21, which couples the grating coupler 32 with the optical modulator 20, is formed in the folding-back region. A portion of the optical waveguide 22, which couples the grating coupler 33 with the optical modulator 20, is formed in the folding-back region.

FIG. 7 illustrates an example of a method of testing an optical IC chip. In this example, a test is conducted on the optical IC chip 100 illustrated in FIG. 5. The test of the optical IC chip 100 is conducted on the wafer before the optical IC chip is cut out of the wafer.

A DC probe 201 includes a terminal for providing phase control signals to the optical modulator 20, a terminal for providing power control signals to the optical modulator 20, and a terminal for obtaining monitor signals of the optical modulator 20. The DC probe 201 is arranged in such a manner that these terminals are in contact with the pads 3 to 8.

A DC probe 202 includes a terminal for providing a power control signal to the optical receiver 10 and a terminal for obtaining a monitor signal of the optical receiver 10. The DC probe 202 is arranged in such a manner that these terminals are in contact with the pads 1 and 2. An RF probe 203 includes a terminal for obtaining electric field information signals RF_out generated by the optical receiver 10.

A fiber array 204 includes the first fiber for inputting an optical signal Rx_in to an optical IC chip, the second fiber for inputting continuous wave light LD_in to the optical IC chip, and the third fiber that propagates an optical signal Tx_out that is output from the optical IC chip. The fiber array 204 is arranged so that tip faces of the first to third fibers face the grating couplers 31 to 33, respectively. Note that the fiber array 204 is arranged along the diffracted radiation direction of the grating couplers 31 to 33. The spacing between first to third fibers contained in the fiber array 204 is substantially the same as the spacing between the grating couplers 31 to 33.

In the first embodiment, a region in which the pads 3 to 8 are formed and a region in which the grating couplers 31 to 33 are formed are kept away from one another. More specifically, as illustrated in FIG. 5, the pads 3 to 8 are formed in an area near the upper side edge of the device region of an optical IC chip 100. On the other hand, the grating couplers 31 to 33 are formed in a specified region on the optical IC chip 100 that is different from the area near the upper side edge of the device region of the optical IC chip 100. In this embodiment, the grating couplers 31 to 33 are formed in the GC region adjacent to the left side edge of the device region of the optical IC chip. This arrangement will not allow physical interference between the DC probe 201 and the fiber array 204 even when the DC probe 201 is in contact with the pads 3 to 8 and the fiber array 204 is arranged near the grating coupler 31 to 33. In this manner, a test of an optical system and a test of an electrical system can be performed at the same time, which allows an efficient testing of an optical IC chip.

After each of optical IC chips is tested on a wafer, each chip is cut out of the wafer. At that time, the GC region and the folding-back region are separated from the device region as illustrated in FIG. 5. As a result, the ends of the optical waveguides 11, 21, and 22 are located at an edge of the chip.

Second Embodiment

According to the configuration illustrated in FIG. 5, in each optical IC chip, a GC region for forming grating couplers and a folding-back region for forming optical waveguides are needed in addition to a device region for forming an optical device circuit. In this case, less number of optical IC chips can be formed on one wafer. The second embodiment solves or mitigates this problem.

Figure 8:
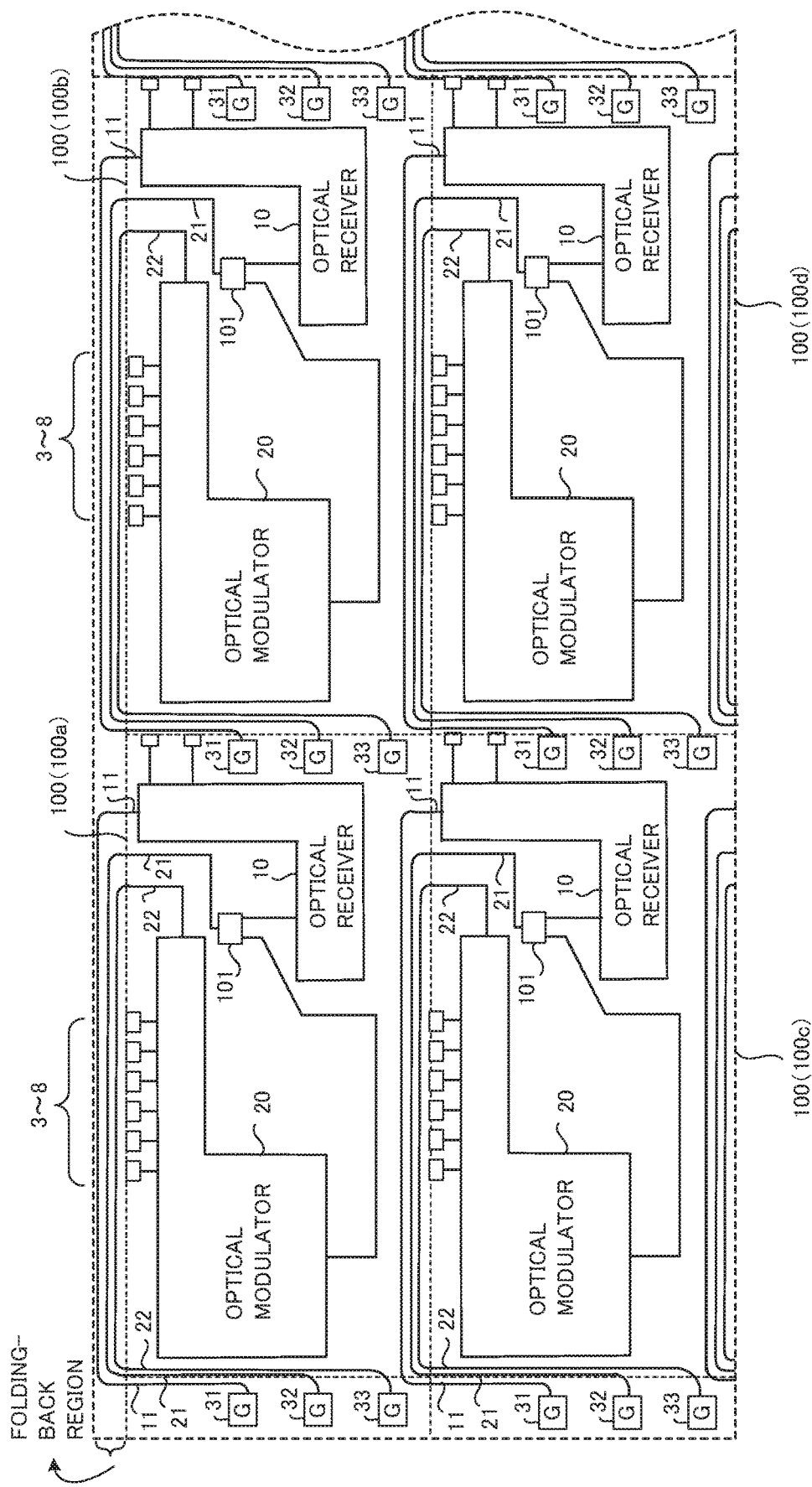
FIG. 8 illustrates an example of an optical IC chip according to the second embodiment.

FIG. 8 illustrates an example of an optical IC chip according to the second embodiment. An optical IC chip 100 has a rectangular shape in this embodiment. The shape of the optical IC chip 100 may be a parallelogram. Note that each of the grating couplers is denoted by "G" in FIG. 8.

In FIG. 8, four optical IC chips 100a to 100d from among a number of optical IC chips 100 formed on a wafer are illustrated, and these four optical IC chips are arranged adjacent to each other in a region at the upper-left corner of the wafer. Note that a folding-back region is provided adjacent to the upper side of the optical IC chips 100a and 100b. In addition, a GC region is provided adjacent to the left side of the optical IC chips 100a and 100c.

The configurations of the optical IC chips 100 (100a to 100d) are substantially the same as each other. In other words, an optical receiver 10, an optical modulator 20, optical waveguides 11, 21, and 22, grating couplers 31 to 33 and pads 1 to 8 are formed in each of the optical IC chips 100. Note that a wiring pattern for transmitting electric field information signals output from the optical receiver 10 and a wiring pattern for transmitting data signals given to the optical modulator 20 are omitted in FIG. 8.

Grating couplers 31 to 33 formed in each optical IC chip 100 are used for testing optical device circuits (here, the optical receiver 10 and the optical modulator 20) formed in an adjacent chip. More specifically, the grating couplers 31 to 33 formed in the optical IC chip 100a are used for testing optical device circuits formed in the optical IC chip 100b. The grating couplers 31 to 33 formed in the optical IC chip 110c are used for testing optical device circuits formed in the optical IC chip 100d. Note that grating couplers 31 to 33 used for testing optical IC chips 100 arranged at the leftmost side on a wafer (in FIG. 8, optical IC chips 100a and 100c) are formed in the GC region.

Optical waveguides 11, 21, and 22 that couple the grating couplers 31 to 33 formed in each optical IC chip 100 with optical device circuits formed in the adjacent chip run through another optical IC chip. For example, the optical waveguides 11, 21, and 22 that couple the grating couplers 31 to 33 formed in the optical IC chip 100c with the optical device circuit formed in the optical IC chip 100d run through the optical IC chip 100b. In other words, a portion of each of the optical waveguides 11, 21, and 22 that couple the grating couplers 31 to 33 formed in the optical IC chip 100c with the optical device circuit formed in the optical IC chip 100d is formed in the optical IC chip 100b. Note that the optical waveguides 11, 21, and 22 that couple the grating couplers 31 to 33 formed in the optical IC chip 100a, which is arranged at the uppermost side on a wafer, with the optical device circuit formed in the optical IC chip 100b, which is also arranged at the uppermost side on the wafer, run through a folding-back region.

At the time of testing each optical IC chip, grating couplers 31 to 33 formed in the adjacent chip are used. For example, when the optical IC chip 100b is tested, the grating couplers 31 to 33 formed in the optical IC chip 100a are used. More specifically, when the optical IC chip 100b is tested, a DC probe 201 is in contact with pads 3 to 8 of the optical IC chip 100b and a fiber array 204 is arranged near the grating couplers 31 to 33 formed in the optical IC chip 100a.

After the optical IC chips are tested on the wafer, each chip is cut out of the wafer. As a result of the dicing, GC regions and folding-back regions are discarded. Some portions of optical waveguides that couple the optical device circuit formed in an optical IC chip with corresponding grating couplers are formed in another optical IC chip (or in a folding-back region). After the dicing, the ends of optical waveguides 11, 21, and 22 coupled to the optical device circuit are located at an edge of the optical IC chip. The ends of optical waveguides 11, 21, and 22 coupled to the grating couplers are also located at an edge of the optical IC chip.

As described above, in the second embodiment, grating couplers for testing an optical IC chip are formed in another optical IC chip. In other words, a region dedicated to grating couplers is not needed in each optical IC chip. Therefore, according to the second embodiment, a size of an optical IC chip is reduced, and the number of optical IC chips formed on a single wafer can be increased than the first embodiment.

Note that in an optical device in which an optical receiver and an optical modulator are mounted on an optical IC chip, a distance between the optical receiver and the optical modulator is, in many cases, designed to be longer than a specified threshold distance in order to suppress crosstalk. For that reason, an optical IC chip that forms such optical device has an unused space. By arranging grating couplers in this unused space of each optical IC chip, grating couplers for adjacent chip can be formed without increasing the size of an optical IC chip.

Third Embodiment

In the configuration illustrated in FIG. 8, grating couplers used for testing an optical device in an optical IC chip is formed in another optical IC chip. In the third embodiment, grating couplers used for testing an optical device in an optical IC chip is formed in the same chip.

Figure 9:
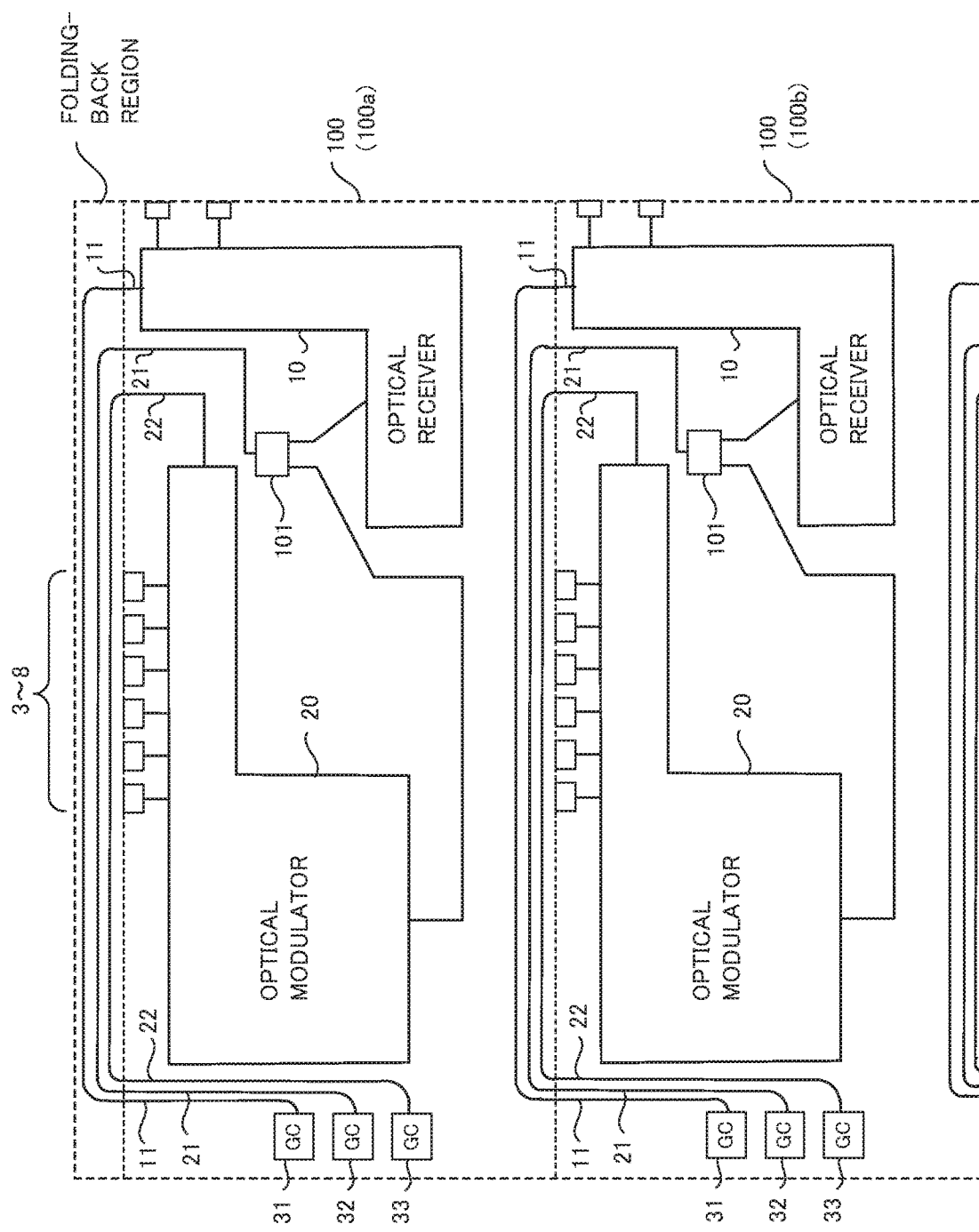
FIG. 9 illustrates an example of an optical IC chip according to the third embodiment.

FIG. 9 illustrates an example of an optical IC chip according to the third embodiment. In the third embodiment, an optical IC chip 100 may also have a rectangular shape or may be parallelogram.

In FIG. 9, two optical IC chips 100a and 100b are illustrated from among a number of optical IC chips 100 formed on a wafer. The optical IC chip 100a is arranged at the uppermost side of the optical IC chips on the wafer. The optical IC chip 100b is arranged adjacent to the lower side of the optical IC chip 100a. Note that a folding-back region is formed adjacent to the upper sides of the optical IC chips 100 that are arranged at the uppermost side of the optical IC chips on the wafer.

Configurations of optical IC chips 100 (100a and 100b) are substantially the same as each other. In other words, an optical receiver 10, an optical modulator 20, optical waveguides 11, 21, and 22, grating couplers 31 to 33, and pads 1 to 8 are formed in each of the optical IC chips 100. Note that in FIG. 9, a wiring pattern that transmits electric field information signals output from the optical receiver 10 and a wiring pattern that transmits data signals given to the optical modulator 20 are omitted.

Grating couplers 31 to 33 formed in an optical IC chip 100 are coupled to an optical device circuit in the same chip. For example, the grating couplers 31, 32, and 33 formed in the optical IC chip 100a are coupled to the optical device circuit (the optical receiver 10 and the optical modulator 20) formed in the optical IC chip 100a through the optical waveguides 11, 21, and 22, respectively.

Optical waveguides 11, 21, and 22 that are coupled to the optical device circuit of an optical IC chip 100 run through an adjacent chip. For example, the optical waveguides 11, 21, and 22 that couple the optical device circuit with the grating couplers 31 to 33 in the optical IC chip 100b run through the optical IC chip 100a. In other words, some portions of the optical waveguides 11, 21, and 22 that couple the optical device circuit with the grating couplers 31 to 33 in the optical IC chip 100b are formed in the optical IC chip 100a. The optical waveguides 11, 21, and 22 of the optical IC chip 100a arranged at the uppermost side of the optical IC chips on a wafer run through a folding-back region.

After optical IC chips are tested on a wafer, each chip is cut out of the wafer. In addition, the folding-back region is discarded. Some portions of optical waveguides that couple the optical device circuit formed in an optical IC chip with corresponding grating couplers are formed in another optical IC chip (or in a folding-back region). After the dicing, the ends of optical waveguides 11, 21, and 22 coupled to the optical device circuit are located at an edge of the optical IC chip. The ends of optical waveguides 11, 21, and 22 coupled to the grating couplers are also located at an edge of the optical IC chip.

As described above, in the third embodiment, a region dedicated to grating coupler is not needed. As a result, the number of optical IC chips that can be formed on a single wafer can be increased.

Fourth Embodiment

In the configuration illustrated in FIG. 9, grating couplers 31 to 33 used for testing an optical device are formed at an edge of each optical IC chip. In the fourth embodiment, grating couplers are formed in a region that is not at an edge on each of optical IC chips 100.

Figure 10:
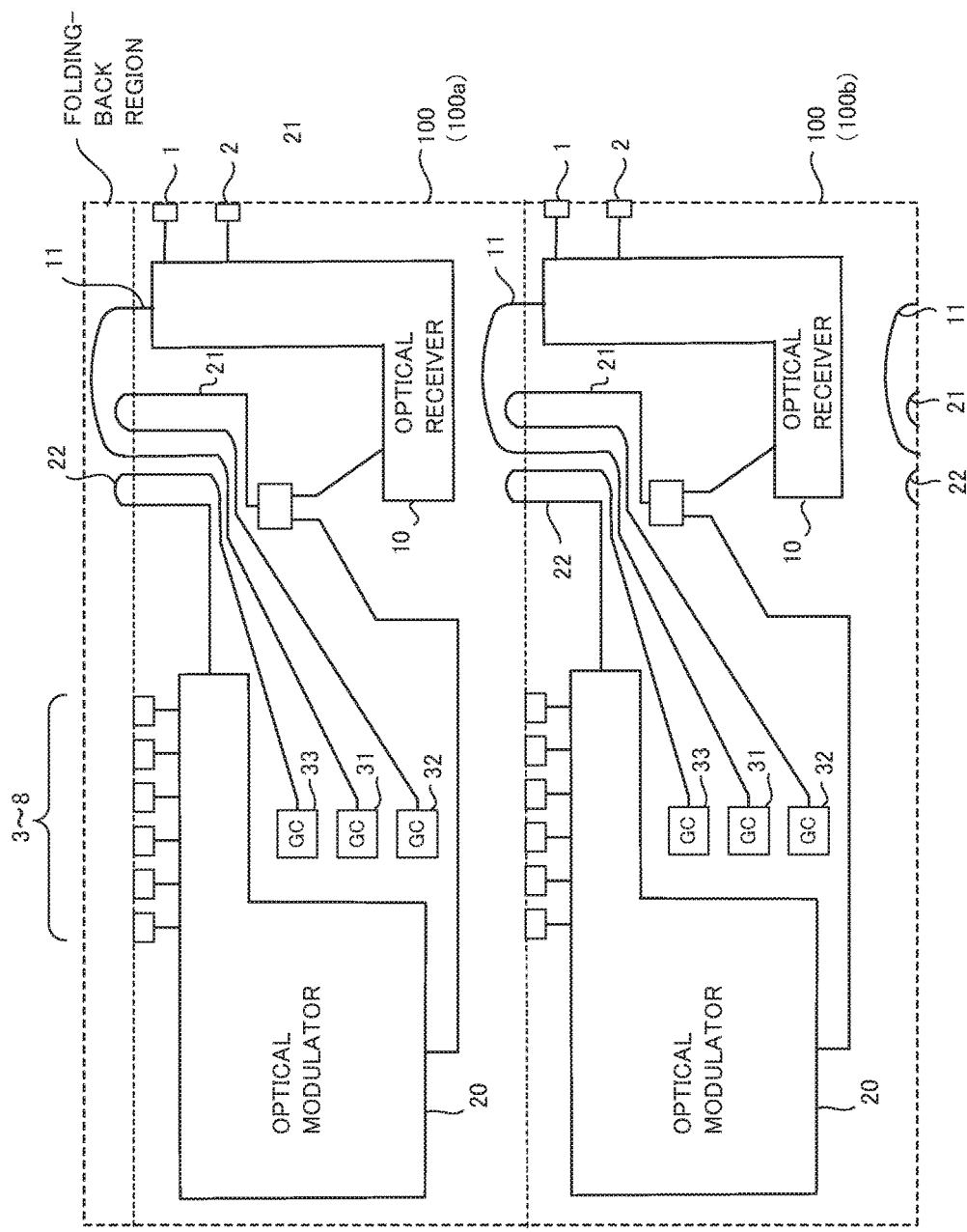
FIG. 10 illustrates an example of an optical IC chip according to the fourth embodiment.

FIG. 10 illustrates an example of an optical IC chip according to the fourth embodiment. In the fourth embodiment, an optical IC chip 100 may also have a rectangular shape or may be parallelogram. In FIG. 10, similarly to the embodiment illustrated in FIG. 9, two optical IC chips 100a and 100b are illustrated from among a number of optical IC chips 100 formed on a wafer.

Configurations of optical IC chips 100 (100a and 100b) are substantially the same as each other. In other words, an optical receiver 10, an optical modulator 20, optical waveguides 11, 21, and 22, grating couplers 31 to 33, and pads 1 to 8 are formed in each of the optical IC chips 100. Note that in FIG. 10, a wiring pattern that transmits electric field information signals output from the optical receiver 10 and a wiring pattern that transmits data signals given to the optical modulator 20 are omitted. The order of arrangement of grating couplers 31 to 33 is different between the configuration illustrated in FIG. 9 and the configuration illustrated in FIG. 10.

The configuration of an optical IC chip 100 according to the third embodiment illustrated in FIG. 9 and the configuration of an optical IC chip 100 according to the fourth embodiment illustrated in FIG. 10 are almost the same. However, in the third embodiment, the grating couplers 31 to 33 are arranged in a region near one of four sides (in FIG. 9, the left side as an example) of the optical IC chip 100. In the fourth embodiment, the grating couplers 31 to 33 are formed in a specific region that is not close to any sides of the optical IC chip 100. In the example illustrated in FIG. 10, the grating couplers 31 to 33 are arranged in a region positioned roughly in the center of the optical IC chip 100.

The grating couplers 31, 32, and 33 are coupled to the optical device circuit (the optical receiver 10 and the optical modulator 20) through the optical waveguides 11, 21, and 22, respectively. Here, some portions of the optical waveguides 11, 21, and 22 are formed in an adjacent chip. For example, in the optical IC chip 100b, some portions of the optical waveguides 11, 21, and 22 that couple the optical device circuit with the grating couplers 31 to 33 are formed in the optical IC chip 100a. Some portions of the optical waveguides 11, 21, and 22 of the optical IC chip 100a arranged at the uppermost side of the optical IC chips on a wafer are formed in a folding-back region.

After optical IC chips are tested on a wafer, each chip is cut out of the wafer. As a result, like the third embodiment, the ends of the optical waveguides 11, 21, and 22 that are coupled to the optical device circuit (the optical receiver 10 and/or the optical modulator 20) are located at an edge of the chip. The ends of optical waveguides 11, 21, and 22 coupled to the grating couplers 31 to 33 are also located at an edge of the chip. Note that the folding-back regions are separated from the optical IC chips 100. Consequently, in the optical IC chip 100a arranged at the uppermost side of the optical IC chips on a wafer, the ends of the optical waveguides 11, 21, and 22 are located at an edge of the chip.

As described above, in the fourth embodiment, like the second and third embodiments, a region dedicated to grating couplers is not needed. As a result, the number of optical IC chips that can be formed on a single wafer can be increased.

Optical Module

FIG. 11 illustrates an example of an optical module according to the embodiments. An optical module 300 includes an optical device 301, a light source 302, and a digital signal processor (DSP) 303.

The optical device 301 is implemented by the optical IC chips 100 illustrated in FIG. 5 and FIG. 8 to FIG. 10. In other words, the optical device 301 includes an optical receiver 10, an optical modulator 20, optical waveguides 11, 21, and 22, and pads 1 to 8. The light source 302 generates CW light. The CW light is guided to the optical waveguide 21. Received optical signal (Rx_In) of the optical device 301 is input to the optical waveguide 11. Modulated optical signal (Tx_Out) generated by the optical modulator 20 is output through the optical waveguide 22. The digital signal processor 303 generates data signals for generating the modulated optical signal in the optical device 301. The digital signal, processor 303 also processes electric signals that represent the received optical signal of the optical device 301.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical device that is formed on an optical IC (integrated circuit) chip having a rectangular shape or a shape of a parallelogram, the optical device comprising:
   an optical device circuit;
   a first optical waveguide that is coupled to the optical device circuit;
   a pad that is electrically connected to the optical device circuit;
   a grating coupler; and
   a second optical waveguide that is coupled to the grating coupler,
   wherein
   the pad is formed in a region close to a first side of the optical IC chip,
   the grating coupler is formed in a specified region, which is not close to the first side, on the optical IC chip, and
   the first optical waveguide and the second optical waveguide are respectively extended to the first side of the optical IC chip.

2. The optical device according to claim 1, wherein the grating coupler is formed in a region close to a second side of the optical IC chip that is different from the first side.

3. The optical device according to claim 1, wherein the grating coupler is formed in a specified region on the optical IC chip, and the specified region is not close to any sides of the optical IC chip.

4. The optical device according to claim 1, wherein
   the optical device circuit includes an optical modulator, and
   the pad includes a pad to which a signal to control a phase of an optical signal generated by the optical modulator is input, a pad to which a signal to control power of the optical signal generated by the optical modulator is input, and a pad from which a signal that represents power of the optical signal generated by the optical modulator is output.

5. The optical device according to claim 1, wherein
   the optical device circuit includes an optical receiver and an optical modulator, and the first optical waveguide includes an optical waveguide configured to guide an input optical signal to the optical receiver, an optical waveguide configured to guide input continuous wave light to the optical modulator, and an optical waveguide configured to transmit an optical signal generated by the optical modulator.

6. An optical device that is formed on an optical IC chip having a rectangular shape or a shape of a parallelogram, the optical device comprising:
an optical receiver;
a first optical waveguide that is coupled to the optical receiver;
an optical modulator;
a second optical waveguide that is coupled to the optical modulator;
a third optical waveguide that is coupled to the optical modulator;
a pad that is electrically connected to the optical modulator;
a first grating coupler;
a second grating coupler;
a third grating coupler;
a fourth optical waveguide that is coupled to the first grating coupler;
a fifth optical waveguide that is coupled to the second grating coupler; and
a sixth optical waveguide that is coupled to the third grating coupler,
wherein
the pad is formed in a region close to a first side of the optical IC chip,
the first to third grating couplers are formed in a specified region, which is not close to the first side, on the optical IC chip, and
the first to sixth optical waveguides are respectively extended to an edge of the optical IC chip.

7. The optical device according to claim 6, wherein the first to third grating couplers are arranged at equal spacing on a straight line.

8. The optical device according to claim 6, wherein diffracted radiation directions of the first to third grating couplers are the same as each other.

9. An optical IC chip having a rectangular shape or a shape of a parallelogram including a first region, a second region adjacent to the first region, and a third region adjacent to the first region, the optical IC chip comprising:
an optical device circuit that is formed in the first region;
a pad that is formed in the first region but at a position that is not adjacent to the second region and that is electrically connected to the optical device circuit;
a grating coupler that is formed in the second region; and
an optical waveguide configured to couple the optical device circuit with the grating coupler,
wherein a portion of the optical waveguide is formed in the third region, and
wherein the IC chip is configured such that the second region and the third region are separable from the first region.

10. A wafer on which a plurality of optical IC chips each having a rectangular shape or a shape of parallelogram are formed,
wherein each of the plurality of optical IC chips comprises:
an optical device circuit;
a pad that is electrically connected to the optical device circuit; and
a grating coupler, and
wherein in each of the plurality of optical IC chips,
the pad is formed in a region close to a first side of each of the plurality of optical IC chips,
the grating coupler is formed in a specified region, which is not close to the first side, on each of the plurality of optical IC chips, and
a portion of an optical waveguide that couples an optical device circuit formed in a first optical IC chip from among the plurality of optical IC chips with a grating coupler formed in a second optical IC chip adjacent to the first optical IC chip is formed in a third optical IC chip adjacent to the first optical IC chip.

11. A wafer on which a plurality of optical IC chips each having a rectangular shape or a shape of parallelogram are formed,
wherein each of the plurality of optical IC chips comprises:
an optical device circuit;
a pad that is electrically connected to the optical device circuit;
a grating coupler; and
an optical waveguide configured to couple the optical device circuit with the grating coupler, and
wherein in each of the plurality of optical IC chips,
the pad is formed in a region close to a first side of each of the plurality of optical IC chips,
the grating coupler is formed in a specified region, which is not close to the first side, on each of the plurality of optical IC chips, and
a portion of the optical waveguide in a first optical IC chip in the plurality of optical IC chips is formed in a second optical IC chip adjacent to the first optical IC chip.

12. An optical transceiver module, comprising:
an optical device;
a light source; and
a digital signal processor configured to generate a data signal for generating a modulated optical signal in the optical device and to process an electric signal that represents a received optical signal of the optical device,
wherein on an optical IC chip having a rectangular shape or a shape of a parallelogram, the optical device comprises:
an optical receiver;
a first optical waveguide that is coupled to the optical receiver;
an optical modulator;
a second optical waveguide that is coupled to the optical modulator;
a third optical waveguide that is coupled to the optical modulator;
a pad that is electrically connected to the optical modulator;
a first grating coupler;
a second grating coupler;
a third grating coupler;
a fourth optical waveguide that is coupled to the first grating coupler;
a fifth optical waveguide that is coupled to the second grating coupler; and
a sixth optical waveguide that is coupled to the third grating coupler, and
wherein
the pad is formed in a region close to a first side of the optical IC chip, the first to third grating couplers are formed in a specified region, which is not close to the first side, on the optical IC chip, the first to sixth optical waveguides are respectively extended to an edge of the optical IC chip, the received optical signal of the optical device is input to the first optical waveguide, continuous wave light generated by the light source is guided to the second optical waveguide, and the modulated optical signal generated by the optical modulator is output through the third optical waveguide.

\* \* \* \* \*